(12) United States Patent
Haris

(10) Patent No.: US 6,468,017 B1
(45) Date of Patent: Oct. 22, 2002

(54) VEHICLE, SYSTEM AND METHOD FOR LOADING AND UNLOADING

(75) Inventor: Clinton Haris, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/717,623

(22) Filed: Nov. 21, 2000

(51) Int. Cl.$^7$ .............................................. B65G 49/07
(52) U.S. Cl. ...................... 414/401; 414/940; 280/35; 280/42
(58) Field of Search ................ 414/940, 401; 280/35, 42

(56) References Cited

U.S. PATENT DOCUMENTS

| | | | | |
|---|---|---|---|---|
| 1,996,523 A | * | 4/1935 | Pfeifer et al. ............... | 414/401 |
| 2,534,367 A | * | 12/1950 | Perrotta et al. .............. | 280/35 |
| 3,270,574 A | * | 9/1966 | Stewart et al. ............... | 280/35 |
| 5,098,244 A | * | 3/1992 | Stimson ....................... | 414/7 |
| 5,655,869 A | * | 8/1997 | Scheler et al. ........... | 414/401 X |
| 5,810,548 A | * | 9/1998 | Stenudd .................... | 280/42 X |

FOREIGN PATENT DOCUMENTS

CH 223747 * 10/1942 ................. 280/35

* cited by examiner

*Primary Examiner*—Steven A. Bratlie

(57) ABSTRACT

A vehicle (10) for transporting a container (12) and for loading and unloading a load port (14) is disclosed. The vehicle (10) comprises a frame (16), a container holder (26) mounted to the frame (16), and front wheels (18) and rear wheels (20) mounted to the frame (16). The front wheels (18) are movable with respect to the rear wheels (20), so that the critical footprint of the vehicle is reduced during loading and unloading. The vehicle is particularly useful in personal guided systems and methods for loading and unloading wafer containers.

15 Claims, 2 Drawing Sheets

VEHICLE, SYSTEM AND METHOD FOR LOADING AND UNLOADING

FIELD OF THE INVENTION

The present invention generally relates to a vehicle for transporting a container and more particularly to a vehicle for transporting a container and for loading and unloading a load port.

The present invention further relates to a method and to a system for transporting a container and more particularly to a method and to a system for transporting a container and for loading and unloading a load port.

BACKGROUND OF THE INVENTION

Semiconductor wafers or other substrates used in the semiconductor industry are usually subjected to several processing steps. Between such processing steps the semiconductor wafers have to be moved from one apparatus to another apparatus or from an apparatus into a stocker or from a stocker to an apparatus. Typically, during such transportation the semiconductor wafers are contained in cassettes in order to keep the wafers isolated from contaminations. typical cassette for such a transfer of wafers is for instance a FOUP (front-opening unified pod), i.e. a box that has a front-opening door that can be opened and closed by robotic equipment.

The wafer containers are frequently transferred automatically between storage systems and processing devices or between different processing devices. However, a transfer is also performed by persons.

In order to ensure a secure transfer of semiconductor containers by persons, there are personal guided vehicles (PGV) provided which are able to hold the wafer containers and which may be moved for transporting a container and for loading and unloading a load port.

When personal guided vehicles are used, the problem occurs that a lot of space is needed in order to guarantee a secure transportation. Such a secure transportation can only be guaranteed, if distances between the persons that guide the vehicles are larger than a minimum distance.

The present invention seeks to solve the above mentioned problems and to provide a vehicle, a method and a system that save space in transporting, loading and unloading of semiconductor wafers.

DETAILED DESCRIPTION OF THE PREFERRED EMBODIMENTS

Figure 1:
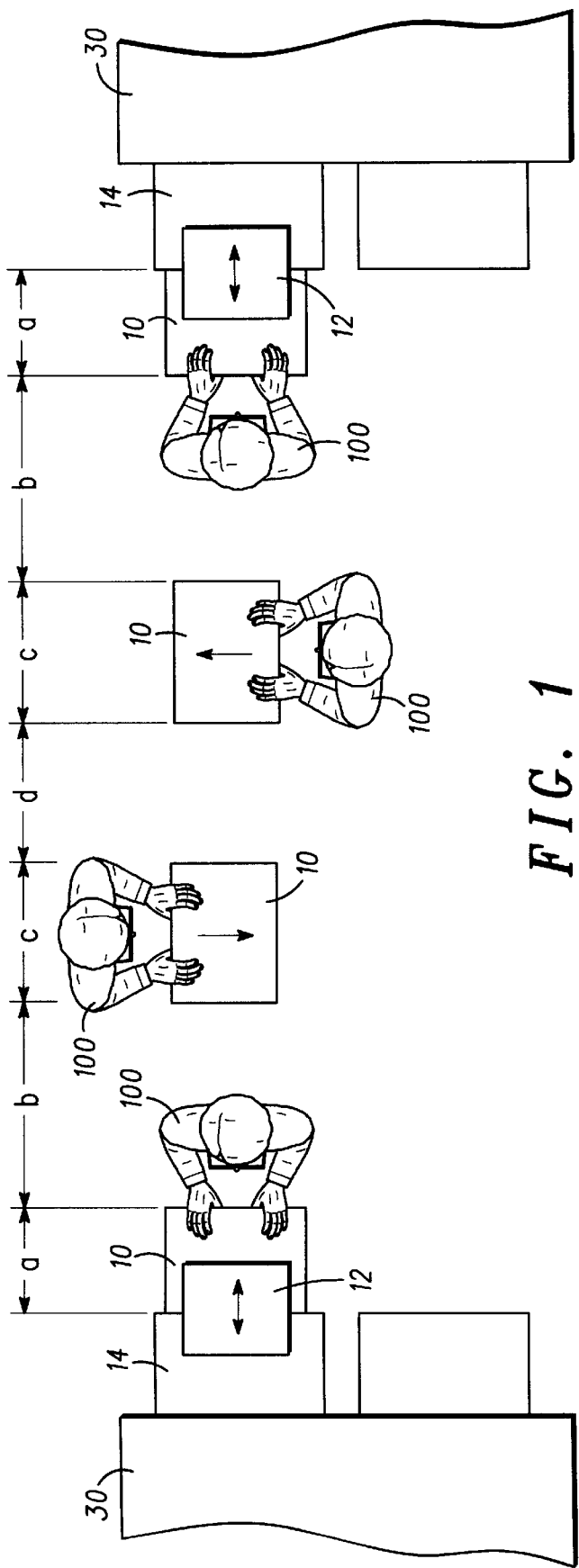
FIG. 1 is a top view of a wafer transporting and storing area.

According to the present invention, a vehicle 10 for transporting a container 12 and for loading and unloading a load port 14 is provided, the vehicle 10 comprising a frame 16, a container holder 26 mounted to the frame 16, and front wheels 18 and rear wheels 20 mounted to the frame 16, wherein the front wheels 18 are movable with respect to the rear wheels 20, so that the critical footprint of the vehicle 10 is reduced during loading and unloading.

According to the invention, there is further provided a method for loading and unloading a load port 14, the method comprising the steps of moving a vehicle 10 to a load port 14, engaging a docking interface 24 of the load port 14 with the vehicle 10, and moving the vehicle 10 further to the load port 14, thereby moving front wheels 18 of the vehicle 10, so that the critical footprint of the vehicle 10 is reduced during loading and unloading.

According to the invention, there is further provided a system for transporting a container 12 and for loading and unloading comprising a vehicle 10 and a load port 14, the vehicle having a frame 16, a container holder 26 mounted to the frame 16, and front wheels 18 and rear wheels 20 mounted to the frame 16, wherein the front wheels 18 are movable with respect to the rear wheels 20, so that the critical footprint of the vehicle 10 is reduced during loading and unloading, and a body of the load port 14 being directly positioned on the floor.

Due to the possibility to move the front wheels 18 with respect to the rear wheels 20, so that the critical footprint, i.e. in particular the size of the footprint in the loading direction, of the vehicle 10 is reduced, the person 100 who is loading or unloading a container 12 is enabled to move closer to the load port 14. Therefore, the total area that is needed during a load or unload operation is reduced. Thus, a secure transfer of wafer containers is still possible, even if the whole transport or storage area, e.g. an area with stockers, is reduced.

FIG. 1 shows a schematic top view of a transport and storing area for wafer containers 12. Personal guided vehicles (PGV) 10 are moved by persons 100. The two persons 100 in the middle of FIG. 1 are moving through the aisle between two stockers 30 in order to reach a load port that is not shown in FIG. 1. The person 100 to the left and the person 100 to the right have already reached a load port 14, and a container 12 is loaded or unloaded by the vehicle 10. The load ports 14 are connected to stockers where the containers are stored. Each of the components that are shown in FIG. 1 require a certain amount of space. Further, there are security regulations that determine minimum values of the critical dimensions a, b, c, d shown in FIG. 1. For example the following dimensions might be sufficient:

a =620 mm (milli meter)

b =400 mm

C =600 mm d =500 mm.

On the basis of the invention, the width of the PGV 10 at the load port 14, in particular the dimension a, can be reduced, and therefore space is saved.

Figure 2:
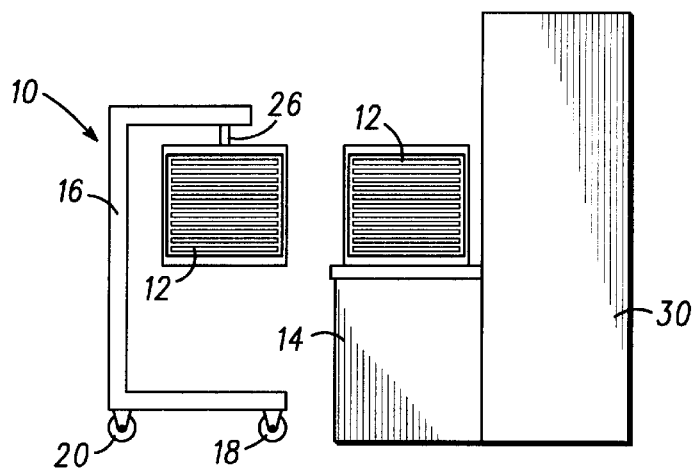
FIG. 2 is a side view of a system for loading and unloading.

FIG. 2 shows a personal guided vehicle 10 in front of a load port 14 in a schematic side view. The PGV 10 comprises a frame 16, a container holder 26, front wheels 18 and rear wheels 20. The container holder 26 holds a con10 tainer 12. The load port 14 is also shown with a con_ tainer on top of it. The container 12 may be transferred from the load port 14 into the stocker 30, or a container 12 can be taken out of the stocker 30 to the load port 14.

Figure 3:
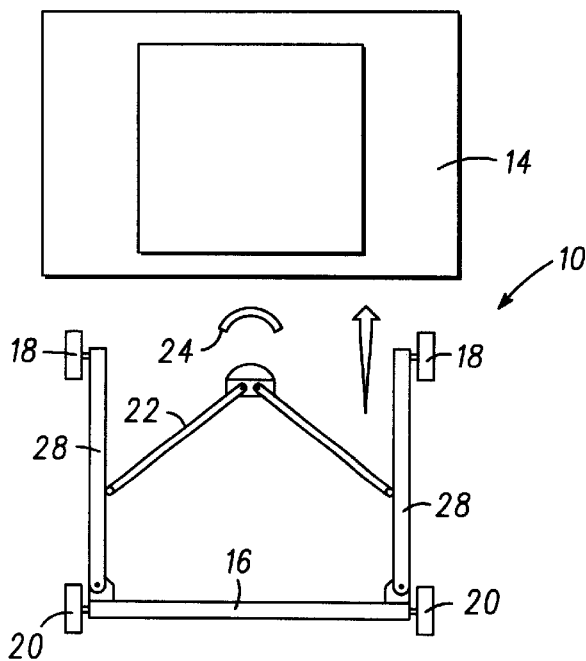
FIG. 3 is a top view of a system for loading and unloading in a first state.
Figure 4:
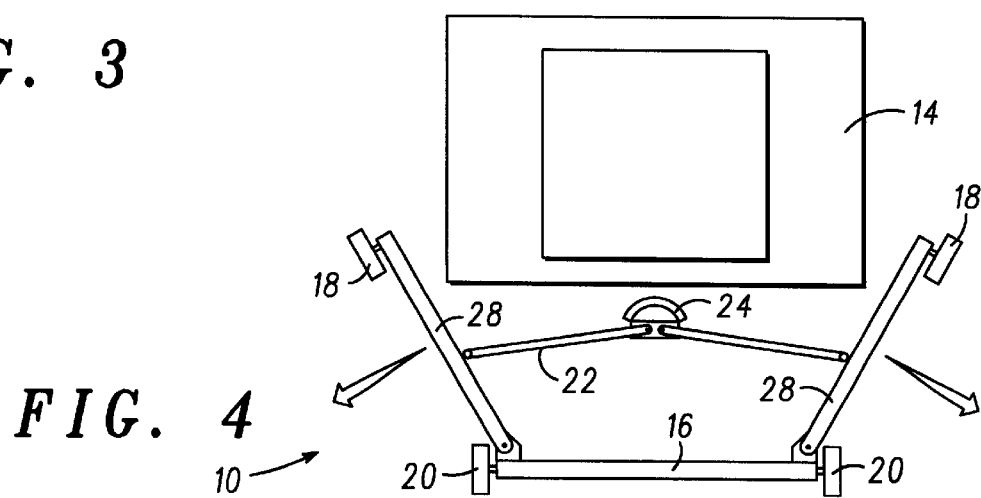
FIG. 4 is a top view of a system for loading and unloading in a second state.

FIG. 3 is a schematic top view of a system according to the present invention that shows a first state of the system. In FIG. 4 a corresponding view is presented that shows a second state of the system.

First, the special construction of the PGV 10 is described. The PGV 10 comprises a frame 16. A part of the frame 16 is formed by lever arms 28. The lever arms 28 carry front wheels 18, so that by pivoting the lever arms 28 the front wheels 18 are moved with respect to the rear wheels 20. A movement of the front wheels 18 may be achieved by shifting the engagement means 22 back in the direction of the rear wheels 20.

Starting from FIG. 3, the PGV 10 is moved in the direction of the load port 14. At a certain time, the angled portion of the engagement means 22 docks in the docking interface 24 of the load port 14. When the PGV 10 is further shifted in the direction of the load port, the engagement means 22 are shifted relative to the rear wheels 20, thereby moving the lever arms 28 to the left side and to the right side, respectively. Consequently, also the front wheels 18 are moved to the sides. As a result, the footprint of the PGV 10 is reduced, so that the total area with a PGV 10 in a loading/unloading position is minimized.

Further, it is advantageous, that the personal guided vehicles 10 may be stored in a space efficient manner, namely with the lever arms 28 straddled to the sides.

The movement of the lever arms 28 back into the ground position may be obtained by resilient means like a spring. Alternatively or additionally it is possible that the docking interface 24 holds the engaging means 22 while drawing back the PGV, thereby pulling the lever arms 28 back into the ground position. The ground position may then be secured by a ledge.

While the invention has been described in terms of particular structures, devices and methods, those of skill in the art will understand based on the description herein that it is not limited merely to such examples and that the full scope of the invention is properly determined by the claims that follow.

What is claimed is:

1. A vehicle for transporting a container and for loading and unloading a load port, comprising:
    a frame;
    a container holder mounted to the frame,
    front wheels and rear wheels mounted to the frame, wherein the front wheels are movable with respect to the rear wheels, and
    spread means, coupled to the front wheels, for spreading the front wheels in response to the spread means coupling to the load port.

2. A vehicle according to claim 1, wherein the front wheels are movable to the sides of the vehicle.

3. The vehicle according to claim 1, wherein the spread means comprises lever arms that are pivotally fixed to the frame.

4. The vehicle according to claim 1, wherein the spread means comprises
    lever arms that are pivotally fixed to the frame, wherein the lever arms are slidably connected by engaging means, and wherein the engaging means comprises means for docking to an interface that is in a fixed position with respect to a load port.

5. A vehicle according to claim 1 the vehicle being a personal guided vehicle (PGV).

6. A method for loading and unloading a load port, the method comprising the steps of
    moving a vehicle having front wheels at the front of the vehicle to a load port,
    engaging a docking interface of the load port at the front of the vehicle, and
    spreading the front wheels of the vehicle in response to moving the vehicle closer to the load port after the step of engaging the docking interface.

7. The method according to claim 6, wherein vehicle is further characterized as having rear wheels and wherein the rear wheels remain fixed while the front wheels are spreading.

8. A method according to claim 6, wherein the front wheels swing to the sides of the vehicle, when the vehicle is moved further to the load port.

9. The method according to claim 6, wherein the spreading step comprises
    sliding engaging means with respect to lever arms that carry the front wheels and thereby forcing the lever arms to the sides.

10. A method according to claim 6, the vehicle being a personal guided vehicle (PGV).

11. A system for transporting a container and for loading and unloading comprising
    a vehicle and
    a load port,
    the vehicle having
        a frame,
        a container holder mounted to the frame,
        front wheels and rear wheels mounted to the frame, and
        spread means, coupled to the front wheels, for spreading the front wheels in response to the spread means coupling to the load port,
    wherein
    a body of the load port being directly positioned on the floor.

12. A system according to claim 11, wherein the front wheels are movable to the sides of the vehicle.

13. A system according to claim 11, wherein the front wheels are mounted to lever arms that are pivotally fixed to the frame.

14. A system according to claim 11, wherein the spread means comprises
    lever arms that are pivotally fixed to the frame, wherein the lever arms are slidably connected by engaging means, and wherein the engaging means comprises means for docking to an interface that is in a fixed position with respect to a load port.

15. A system according to claim 11, the vehicle being a personal guided vehicle (PGV).

* * * * *